United States Patent
Nakayama et al.

(10) Patent No.: US 12,306,253 B2
(45) Date of Patent: May 20, 2025

(54) SHIELDING ROTATION TRANSMISSION MECHANISM, MOTOR/INVERTER TEST BENCH USING SAME, AND EMC TEST EQUIPMENT DEVICE

(71) Applicants: Ohtama Co., Ltd., Inagi (JP); TODA RACING Co., Ltd., Kurashiki (JP)

(72) Inventors: Masaru Nakayama, Kashima (JP); Koji Kajitani, Soja (JP)

(73) Assignees: Ohtama Co., Ltd., Inagi (JP); TODA RACING Co., Ltd., Kurashiki (JP)

( * ) Notice: Subject to any disclaimer, the term of this patent is extended or adjusted under 35 U.S.C. 154(b) by 492 days.

(21) Appl. No.: 17/908,551

(22) PCT Filed: Mar. 4, 2021

(86) PCT No.: PCT/JP2021/008455
§ 371 (c)(1),
(2) Date: Sep. 1, 2022

(87) PCT Pub. No.: WO2021/177408
PCT Pub. Date: Sep. 10, 2021

(65) Prior Publication Data
US 2023/0110340 A1   Apr. 13, 2023

(30) Foreign Application Priority Data
Mar. 4, 2020   (JP) .................. 2020-036882

(51) Int. Cl.
*H02K 11/00* (2016.01)
*G01R 29/08* (2006.01)
(Continued)

(52) U.S. Cl.
CPC ....... *G01R 31/343* (2013.01); *G01R 29/0821* (2013.01); *G01R 29/0835* (2013.01);
(Continued)

(58) Field of Classification Search
CPC .... H02K 11/012; H02K 11/026; H02K 11/00; H02K 11/20; H02K 11/02; H02K 11/141;
(Continued)

(56) References Cited

U.S. PATENT DOCUMENTS

| | | | |
|---|---|---|---|
| 2011/0256942 A1 | 10/2011 | Ohtsuka et al. | |
| 2023/0336050 A1* | 10/2023 | Barendrecht | .......... H02K 11/21 |

FOREIGN PATENT DOCUMENTS

| | | |
|---|---|---|
| CN | 103149480 A | 6/2013 |
| JP | S62-109494 U1 | 7/1987 |

(Continued)

OTHER PUBLICATIONS

PCT/JP2021/008455, Apr. 27, 2021, Translation of the International Search Report and Written Opinion.

*Primary Examiner* — Hai L Nguyen
(74) *Attorney, Agent, or Firm* — Wolf, Greenfield & Sacks, P.C.

(57) ABSTRACT

During EMC testing of electric motors, a rotation transmission device that penetrates a wall in an electromagnetic anechoic chamber has been unable to achieve high rotation and high torque, because of the skipping rope phenomenon. In order to achieve rotation transmission at high rotation and high torque, a fiber-reinforced plastic shaft is supported by a bearing inside a conductive housing; and a conductive brush that obstructs a space between the housing and the shaft surface is provided so as to provide electrical conduction between the housing and the shaft and prevent radio wave leakage. A plurality of bearings could be used, excluding at both ends, in order to achieve rotation transmission at high rotation and high torque.

7 Claims, 1 Drawing Sheet

(51) Int. Cl.
  *G01R 31/34* (2020.01)
  *H02K 7/00* (2006.01)
  *H02K 11/20* (2016.01)
  *H05K 9/00* (2006.01)

(52) U.S. Cl.
  CPC ............ *H02K 7/003* (2013.01); *H02K 11/20* (2016.01); *H05K 9/009* (2013.01)

(58) Field of Classification Search
  CPC ........ H02K 11/21; H03K 7/00; H03K 7/0073; H03K 7/0081; H05K 9/009; H05K 9/0081; G01R 31/34; G01R 31/343
  USPC .................................. 333/12, 248, 260, 261
  See application file for complete search history.

(56) References Cited

FOREIGN PATENT DOCUMENTS

| | | |
|---|---|---|
| JP | 2007-196681 A | 8/2007 |
| JP | 2011-017413 A | 1/2011 |
| JP | 2016-055658 A | 4/2016 |
| WO | WO 2010/055578 A1 | 5/2010 |

\* cited by examiner

[Fig. 1]
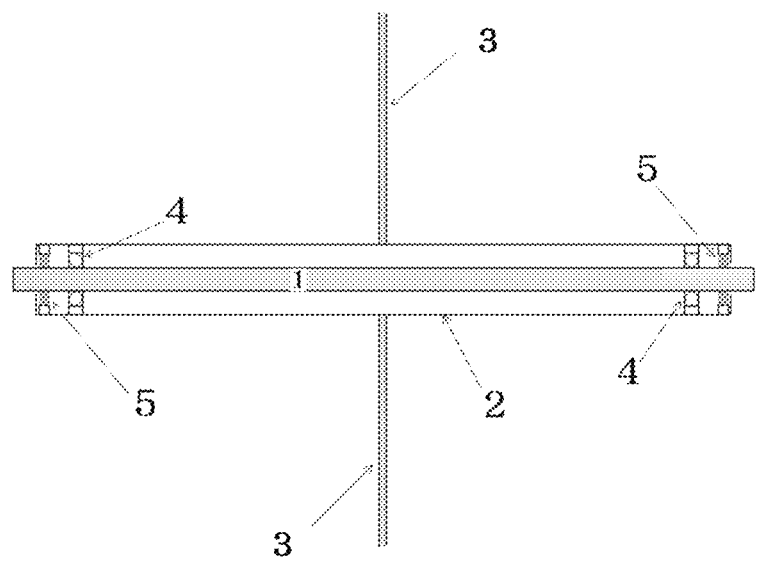
[Fig. 2]
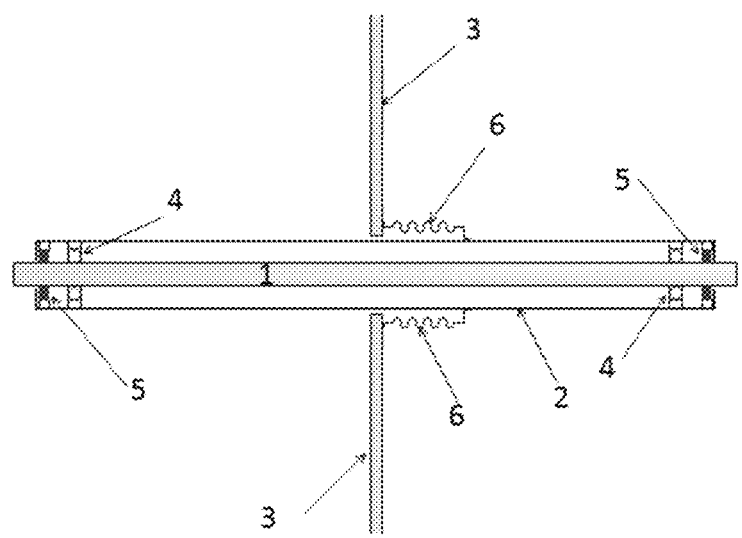

SHIELDING ROTATION TRANSMISSION MECHANISM, MOTOR/INVERTER TEST BENCH USING SAME, AND EMC TEST EQUIPMENT DEVICE

RELATED APPLICATION

This application is a national stage filing under 35 U.S.C. § 371 of International Patent Application Serial No. PCT/JP2021/008455, filed Mar. 4, 2021, which is incorporated herein by reference in its entirety.

TECHNICAL FIELD

The present invention relates to a high speed rotation transmission shaft configuration suitable for use in a motor test bench and EMC (Electromagnetic Compatibility) testing, etc., which can effectively transmit rotation even at high rotation speed; a transmission device for the motor test bench using the shaft structure; and a transmission device and a testing device using the shaft configuration which transmits high torque and high rotation between mechanical rotating devices such as motor and generator that exist inside and outside of an electromagnetic anechoic chamber, but intercepts electromagnetic noise. More specifically, the present invention relates to a rotation transmission mechanism suitable for use in the motor test bench for motor testing, and for use in a device for conducting EMC evaluation testing of an electric motor and an inverter system for moving power of vehicle used in EV (Electric Vehicle), HV (Hybrid Vehicle), PHEV/PHV (Plug-in Hybrid Vehicle) and FCV (Fuel Cell Vehicle), etc. as a component in an electromagnetic anechoic chamber while simulating the driving state of an actual automobile.

BACKGROUND ART

A rotation transmission means of a form that thrust force transmission is borne by a rigid tube and only rotation force is transmitted by a rotation shaft by accommodating the rotating shaft in the rigid tube and rotatably supporting the shaft with bearings installed at both ends of the rigid tube was known as a torque tube in the field of power transmission of vehicles.

The torque tube of an automobile has been used for rotation force transmission at a portion with suspension movements, because it has an advantage that it is not required for a rotation force transmission mechanism of the shaft to deal with swinging movements since the thrust force transmission is borne by the rigid tube even if swinging movements of a suspension occurs.

However, torque tubes have not been used for the motor test bench and an EMC testing device, etc. in which the relative position of power source and rotational load of rotation force transmission never change from the beginning, while used only in the place where dealing with swinging motion is necessary, because of the complicated configuration that the shaft is inserted into the rigid tube and supported by the bearings at both ends.

Also, conventionally it was common to use a metal shaft for the rotation shaft in the motor test bench and EMC testing.

Also, the electromagnetic anechoic chamber used for EMC testing is an equipment designed and equipped to prevent electromagnetic wave from penetrating from outside of the chamber so that only electromagnetic wave generated by the sample apparatus in the chamber can be measured, and is devised so that electromagnetic wave does not leak outside of the electromagnetic anechoic chamber when checking phenomena such as malfunction by irradiating or injecting electromagnetic wave into the sample apparatus in the electromagnetic anechoic chamber.

Conventionally, EMC testing of a driving power motor for an automobile has been conducted with a sample apparatus (motor) being set to operating state (such as stand-by/normal operation). However, in the operating state, the motor was not loaded, i.e. not in the state that the automobile was actually running, but in idling state.

Also, EMC testing of an inverter for motor control was not in loading state simulating automobile running state as previously mentioned, even though the motor was connected as a load.

While such conventional EMC evaluation methods were done, the international standards, CISPR 25 Edition 4:2016 (emission measurements) and ISO 11452-2:2019 (immunity testing), were developed and conditions regarding test setup were defined. According to these definitions, the electric motor which is the sample set in the electromagnetic anechoic chamber must be mechanically connected to the load motor outside of the electromagnetic anechoic chamber.

However, it is not easy to shut off electromagnetic wave when the shaft which mechanically connects the electric motor and the load motor, and rotates at high speed penetrates inside and outside of the electromagnetic anechoic chamber through a hole in a wall of the electromagnetic anechoic chamber.

Furthermore, it is defined by above mentioned international standards that the distance between the sample apparatus (the electric motor) and end of a wave absorber attached to the inside wall of the electromagnetic anechoic chamber should be 1000 mm or more. Therefore, the distance between the electric motor and the load motor will have to be 1500 mm or more considering mechanical mechanism parts such as wave absorber and coupling to be connected.

When a shaft of 1000 mm or longer as seen in the test setup drawing of the international standards is used and is rotated at high speed, the weight and deflection of the shaft cause skipping rope phenomenon and there is a risk that the equipment is damaged, but no special countermeasure is defined in the international standards.

Conventionally, in order to avoid the skipping rope phenomenon, the length of the shaft portion which rotates at high speed was tried to be made as short as possible by installing a speed reducer at a position close to the electric motor tested in high speed rotation state, and reducing the rotation speed of the shaft connected to the load motor by a fraction to a few tenths of the revolution.

However, the installation of the speed reducer between the electric motor and the load motor requires its cooling system and temperature management, maintenance of mechanical parts, and countermeasure against static electricity or electromagnetic wave. Furthermore, because the installation of the speed reducer between the shafts causes inclusion of uncertain factors such as efficiency of the speed reducer in evaluation testing of the electric motor, the evaluation must be performed considering these factors adding to the uncertainty of the electric motor itself.

In the prior art EMC testing of the motors used for electric automobiles, etc., above mentioned problems were existing.

A conventional example of light weight technology for rotation force transmission device in another field which is not related to EMC testing existed in the form of Patent Document 1.

This document describes the use of CFRP in rotation force transmission means for weight reduction and rigidity increase in an automobile propeller shaft, reciting as "the rear propeller shaft 44 is a hollow pipe made of carbon fiber-reinforced plastic (CFRP) aiming weight reduction and rigidity increase because there is plenty of space available, as described below" (refer to paragraph 0044). However, this is regarding to the automobile propeller shaft and it has nothing to do with EMC testing of the electric motor, nor does it demonstrate rotation force transmission between inside and outside of the electromagnetic anechoic chamber in EMC testing in terms of required torque and rotation speed.

Patent Document 2 also, discloses "a shaft for power transmission being a pipe shaped CFRP (carbon fiber-reinforced plastic) member formed by CFRP, light weight high strength material" (refer to paragraph 0018) as a highly rigid and light weight rotation transmission shaft, but it is just a shaft which is not for the test bench or the EMC testing nor does it have a structure that the rotation shaft is installed withing a rigid cylinder.

Also, Patent Document 1 and 2 is not intended to use from a low speed rotation to a high speed rotation of 15000 rpm or higher which was achieved by the present invention.

In the prior art related to dynamo testing and EMC testing of the motor used for an electric automobile, etc., no patent document disclosing invention that complies with above mentioned international standards is found.

CITATION LIST

Patent Documents

[Patent Document 1] JP-A-2016-055658
[Patent Document 2] JP-A-2011-017413

SUMMARY OF THE INVENTION

Problem to be Solved by the Invention

In a test bench, etc. of a motor, the centering work to align the shaft accurately on dynamo side and motor side of the rotation shaft involves great difficulty. Subjects considered as problems to be solved by the invention of the present application are: in a device in which rotation transmission is performed between drive side and driven side, achieving high speed rotation and making centering work easy; achieving high speed rotation even with a long span; furthermore in addition to these, achieving superior radio wave cut off as well as high speed rotation and high torque transmission in a device in which radio wave cut off between drive side and driven side is required.

When a drive source rotation device and a driven rotation device are connected by the rotation shaft, both of the drive source device and the driven rotation device has to be fixed on a floor and the centering of the rotation shaft between the drive source device and the driven device has to be highly accurate.

Therefore, all of the rotation shaft connecting both, the drive source device and the driven rotation device has to be accurately centered. For this centering work, the bearings supporting the rotation shaft near its both ends has to be fixed on a surface table on which the drive source and the driven rotor are fixed, the rotation shaft being accurately supported by the bearings.

Since a hole has to be made in the wall of the electromagnetic anechoic chamber and the rotation shaft rotating at high speed has to be penetrated through the hole in the testing of the rotation devices in the electromagnetic anechoic chamber, the blocking of electromagnetic wave of the electromagnetic anechoic chamber inevitably be inferior compared to a state with no hole.

Also, because there is inversely proportional relationship between the torque of the motor and the reduction ratio of the speed reducer, installing the speed reducer decreases the rotating speed at the output shaft of the speed reducer but increases the torque. Thus, the rotation number of the connected load motor can be reduced to a fraction, but several times of torque is required. In other words, installing the speed reducer allows the electric motor to operate at high rotation speed, but reduced torque results in insufficient testing of the electric motor.

Therefore, it is desirable to use a mechanism in which the ratio of rotation speed and the ratio of torque are 1:1 without installing a speed reducer, but in the conventional art, the testing equipment without a speed reducer makes the length of the connecting shaft between the sample equipment, the electric motor and the load motor, longer and causes skipping rope phenomenon when rotating at high speed, and may damage the apparatus/equipment.

Therefore, there is a problem to be solved that a rotation transmission mechanism with abilities that transmittable torque is high, the length of the shaft is long while no issue is raised even at high speed rotation, and electromagnetic noise which can pass through the wall of the electromagnetic anechoic chamber is completely intercepted or is reduced as less as possible is to be provided. The present invention provides a rotation transmission mechanism that solves this problem. Also, the present invention has solved this problem and thus can provide a device which achieves EMC testing of rotation electric apparatus such as motors under various conditions such as low speed rotation-high torque and high speed rotation-low torque.

Means for Solving the Problems

The invention of this application comprises following embodiments.

[1] A rotation transmission device having a conductive rigid cylinder fixed on a surface table at its both ends, bearings provided at both ends parts of said conductive rigid cylinder and a shaft made of conductive fiber-reinforced plastic supported by the bearings, wherein the shaft length is 900 mm or longer, the rotation speed is possible at 16,000 revolutions per minute (r.p.m.) or more, and electromagnetic wave shielding is made by conductive resin fiber brushes which obstruct the space by being contact with the shaft periphery at both ends of the conductive rigid cylinder.

[2] The rotation transmission device for electromagnetic shield boundary according to [1], comprising the conductive rigid cylinder, the bearings provided at both ends parts of said conductive rigid cylinder and the shaft made of conductive fiber-reinforced plastic supported by the bearings, wherein electrical conduction between the shaft and the conductive rigid cylinder is secured at both ends of the rigid cylinder.

[3] The device according to [1] or [2], wherein the conductive fiber-reinforced plastic contains carbon fiber.

[4] A rotation transmission device for electromagnetic shield boundary comprising the device according to any one of [1] to [3] and an electromagnetic shield boundary wall, wherein electrical conduction is secured and electromagnetic shielding is performed between the shaft and the conductive rigid cylinder at both ends of the conductive rigid cylinder, and between the conductive rigid cylinder and the boundary wall at the boundary wall.

[5] The device according to [4], wherein a joining portion of the conductive rigid cylinder and the electromagnetic shield boundary wall comprises a structure of jointing the boundary wall and the conductive rigid cylinder via a conductive flexible shield jointed to the shield wall.

[6] An electromagnetic anechoic chamber having the rotation transmission device according to any one of [1] to [5].

[7] The electromagnetic anechoic chamber according to claim 6, further comprising driving load which can be run at rotation speed of 16,000 revolutions per minute (r.p.m,) or more.

The inventors of the invention of this application have found that, in a test bench that requires the shaft to transmit rotation, the simple rotation shaft supported by bearings fixed on the floor requires adjustment of mutual position of the two bearings, which causes difficulty on centering work, but in contrast to this, with a configuration in which the rotation shaft is supported at both ends of the rigid cylinder, a shaft of so called torque tube type, both ends of the rotation shaft can be centered by only fixing the rigid cylinder on the floor, so that only accurate positioning of the rigid cylinder makes centering with both of rotation drive source and driven rotation device easy.

Also, the inventors of the invention of this application have found that, in order to achieve high speed rotation without skipping rope phenomenon, the rotation shaft should have high torsional rigidity while having light weight. And, for this purpose, they have found that a shaft made of carbon fiber-reinforced plastic can be used.

The inventors have found also that electric charge of the conducted rotation shaft can be immediately released to ground potential via the metal bearings because carbon is contained in the shaft made of carbon fiber-reinforced plastic. Furthermore, they have found that the shaft and the conductive rigid cylinder, for example metal rigid cylinder cover covering the shaft, penetrate the wall of the electromagnetic anechoic chamber, and high frequency can be shielded by conductive fiber electrically connected to the metal cover surrounding circumference of the shaft surface.

When a metal shaft is used, it is impossible to prevent skipping rope phenomenon with bearings only at both ends. Also, the metal shaft has so high conductivity that it is not suitable for use in the electromagnetic anechoic chamber.

A grounding effect can be expected by blocking the shaft rotating at high speed with a shield box which is the conductive rigid cylinder, and supporting the rotation shaft using the metal bearings at both ends of the shield box. Furthermore, a shielding effect is improved by obstructing the space by contacting conductive resin brushes with the shaft periphery at both ends of the shield box.

The shield box is conductive and electrically connected with the electromagnetic blocking wall to maintain electromagnetic shielding.

In the present invention, torque capacity of a load motor is maximally utilized instead of using a speed reducer. The distance between the electric motor, which is a sample apparatus, and the load motor outside of the electromagnetic anechoic chamber becomes longer because of not using the speed reducer, however, using a shaft made of carbon fiber-reinforced plastic results in light weight and high rigidity, and no problem arises at low speed rotation to even at high speed rotation.

The term "conductive" in the terms "conductive rigid cylinder" as used herein refers to material having conductivity of metals such as aluminum, iron, copper and brass, i.e., volume resistivity value of $2 \times 10{-8}$ Ωm to $100 \times 10{-8}$ Ωm at room temperature, and the term "rigid" refers to a degree of rigidity of the level which these metals have.

Also, the term "test bench" refers to a facility in which a rotation force drive source fixed on a floor is connected with a driven rotation device fixed on the same floor to perform some sort of test such as output testing of the rotation drive source or radio wave testing in rotating state.

Furthermore, the term "shaft length" refers to the distance between the bearings at both ends of the conductive rigid cylinder.

Advantageous Effects of Invention

The conductive rigid cylinder is most preferably a cylinder, and since it is a rigid body, it is sufficient for accurate positioning of the rotation shaft if the conductive rigid cylinder is fixed on the floor. The most accurate positioning of the rotation shaft is to fix the conductive rigid cylinder at each position near both ends thereof.

This floor may be a surface table so that the relative position of both ends of the rotation shaft is decided and immovable.

Also, since the conductive rigid cylinder which serves as a housing of the rotation shaft is a rigid body, the position fluctuation during operation at the joining portion with the wall when the shaft penetrates the wall is extremely small.

According to the invention of the present application, the EMC testing defined by international standards become possible because electromagnetic wave does not leak even if a hole is made in the wall of the electromagnetic anechoic chamber, and even if a wide range of torque from low to high torque is applied, and even if rotation from slow speed of several tens of revolutions per minute to high speed rotation of several tens of thousands revolutions per minute which are required by EMC testing are actually realized the testing is possible.

Also, preventing skipping rope phenomenon is achieved by using carbon fiber-reinforced plastic for the shaft.

Therefore, transmitting higher torque and higher rotation than conventional ones are achieved, for example, using 900 mm shaft length or even with longer one, at 20,000 revolutions per minute and 350 Nm of transmission torque can be realized.

BRIEF DESCRIPTION OF DRAWINGS

FIG. 1 is a drawing showing an example of a device according to the present invention.

FIG. 2 is a drawing showing an example of a device having a conductive flexible shield according to the present invention.

EMBODIMENTS FOR CARRYING OUT THE INVENTION

Followings are descriptions with reference to FIG. 1. A hollow shaft made of carbon fiber-reinforced plastic is used for a shaft 1 to realize a rotation shaft which is light weight and can withstand high speed rotation.

The shaft is extending through a housing 2 being a cylinder as a conductive rigid cylinder, and conductivity and electromagnetic wave shielding are ascertained by the use of bearings 4 and conductive fiber brushes 5 at both ends of the housing 2, so as to provide shielding.

The conductive housing 2 is fixed on a floor where the device is installed as well as being joined to a shield wall 3.

The conductive housing 2 shielding the rotation shaft 1 is electrically joined to the shield wall 3 of an electromagnetic anechoic chamber to prevent electromagnetic wave leakage. Leakage of electric current or electromagnetic wave from one side to the other side of the wall is prevented since the electric current does not penetrate through the conductive shaft but escape from the housing 2 to the wall via the conduction means between the rotation shaft and the housing 2. The shield wall and the conductive housing do not have to be completely sealed as far as electromagnetic wave leakage is sufficiently small. This electromagnetic anechoic chamber is a suitable electromagnetic anechoic chamber, for example, for use of EMC testing of an electric motor for an electric automobile.

As shown in FIG. 2, a shield wall 3 and a conductive housing 2 also can be joined by a conductive flexible shield 6. For example, a metal bellows, a flexible conductive mesh material and conductive woven fabric, etc. are usable for the conductive flexible shield 6.

A rotation transmission mechanism according to the present invention achieves transmission of rotational motion at high speed rotation with unprecedented high torque while maintaining electromagnetic shielding. Therefore, the electromagnetic anechoic chamber for EMC testing using this mechanism achieves testing at unprecedented high speed rotation.

The electromagnetic anechoic chamber according to the present invention can effectively cut off the electromagnetic wave of 9 kHz to several GHz, which is required by EMC testing.

LIST OF REFERENCE NUMERALS

1 rotation shaft
2 conductive rigid cylinder (conductive housing)
3 electromagnetic anechoic chamber shield wall
4 bearing
5 conductive fiber brush
6 conductive flexible shield

What is claimed is:

1. A rotation transmission device having a conductive rigid cylinder fixed on a surface table at its both ends, bearings provided at both ends parts of said conductive rigid cylinder and a shaft made of conductive fiber-reinforced plastic supported by the bearings, wherein the shaft length is 900 mm or longer, the rotation speed is possible at 16,000 revolutions per minute (r.p.m.) or more, and electromagnetic wave shielding is made by conductive resin fiber brushes which obstruct the space by being contact with the shaft periphery at both ends of the conductive rigid cylinder.

2. The rotation transmission device for electromagnetic shield boundary according to claim 1, comprising the conductive rigid cylinder, the bearings provided at both ends parts of said conductive rigid cylinder and the shaft made of conductive fiber-reinforced plastic supported by the bearings, wherein electrical conduction between the shaft and the conductive rigid cylinder is secured at both ends of the rigid cylinder.

3. The device according to claim 1, wherein the conductive fiber-reinforced plastic contains carbon fiber.

4. A rotation transmission device for electromagnetic shield boundary comprising the device according to claim 1 and an electromagnetic shield boundary wall, wherein electrical conduction is secured and electromagnetic shielding is performed between the shaft and the conductive rigid cylinder at both ends of the conductive rigid cylinder, and between the conductive rigid cylinder and the boundary wall at the boundary wall.

5. The device according to claim 4, wherein a joining portion of the conductive rigid cylinder and the electromagnetic shield boundary wall comprises a structure of jointing the boundary wall and the conductive rigid cylinder via a conductive flexible shield jointed to the shield wall.

6. An electromagnetic anechoic chamber having the device according to claim 1.

7. The electromagnetic anechoic chamber according to claim 6, further comprising driving load which can be run at rotation speed of 16,000 revolutions per minute (r.p.m.) or more.

* * * * *